United States Patent
Yang et al.

(10) Patent No.: US 6,395,654 B1
(45) Date of Patent: May 28, 2002

(54) METHOD OF FORMING ONO FLASH MEMORY DEVICES USING RAPID THERMAL OXIDATION

(75) Inventors: Jean Yang, Sunnyvale; Yider Wu; Hidehiko Shiraiwa, both of San Jose; Mark Ramsbey, Sunnyvale, all of CA (US)

(73) Assignees: Advanced Micro Devices, Inc., Sunnyvale, CA (US); Fujitsu Limited, Kanagawa (JP)

( * ) Notice: Subject to any disclaimer, the term of this patent is extended or adjusted under 35 U.S.C. 154(b) by 0 days.

(21) Appl. No.: 09/648,077

(22) Filed: Aug. 25, 2000

(51) Int. Cl.[7] ................ H01L 21/225; H01L 21/336
(52) U.S. Cl. ........................... 438/954; 438/306
(58) Field of Search ................ 438/305, 142, 438/149, 151, 210, 407, 201, 289, 535, 585, 923, 954, 792, 769, 765; 428/446; 257/9

(56) References Cited

U.S. PATENT DOCUMENTS

| | | | |
|---|---|---|---|
| 5,403,786 A | * 4/1995 | Hori | 438/585 |
| 5,464,792 A | * 11/1995 | Tseng et al. | 438/585 |
| 5,882,987 A | * 3/1999 | Srikrishnan | 438/458 |
| 6,044,203 A | * 3/2000 | Dawson et al. | 392/416 |
| 6,159,795 A | * 12/2000 | Higashitani et al. | 438/257 |
| 6,184,110 B1 | * 2/2001 | Ono et al. | 438/513 |
| 6,248,628 B1 | * 6/2001 | Halliyal et al. | 438/257 |
| 6,248,633 B1 | * 6/2001 | Ogura et al. | 438/267 |

OTHER PUBLICATIONS

"ELectrical and Physical Properties of Ultrathin Reoxidized Nitrided Oxides Prepared by Rapid Thermal Processing." Hori, T.; Iwasaki, H.; Tsuji, K. IEEE Transactions on Electron Devices, vol. 36, No. 2, 1989, pp. 340–350.*

"Evaluation of Rapid Thermal Nitrided ONO Interpoly Dielectric Resistance to Plasma Process–Induced Damage." Cha, C.; Chor, E.; Gong, H.; Zhang, A.; Dong, Z.; and Chan, L. 4th Int'l Symposium on Plasma Process–Induced Damage, May 10–11, 1999, pp. 49–52.*

Silicon Processing for the VLSI Era. Wolf, S. and Tauber, R.N. vol. 1, second ed. Lattice Press, 2000.*

* cited by examiner

Primary Examiner—Richard Elms
Assistant Examiner—Beth E. Owens
(74) Attorney, Agent, or Firm—Eschweiler & Associates, LLC

(57) ABSTRACT

A gate structure for an ONO flash memory device includes a first layer of silicon oxide on top of a semiconductor substrate, a second layer of silicon oxide, a layer of silicon nitride sandwiched between the two silicon oxide layers, and a control gate on top of the second layer of silicon oxide. Nitrogen is implanted into the first layer of silicon oxide and then the semiconductor structure is heated using a rapid thermal tool to anneal out the implant damage and to diffuse the implanted nitrogen to the substrate and silicon oxide interface to cause SiN bonds to be formed at that interface. The SiN bonds are desirable because they improve the bonding strength at the interface and the nitrogen remaining in the silicon oxide layer increases the oxide bulk reliability.

14 Claims, 7 Drawing Sheets

(OPTIONAL)

METHOD OF FORMING ONO FLASH MEMORY DEVICES USING RAPID THERMAL OXIDATION

BACKGROUND OF THE INVENTION

1. Field of the Invention

The invention relates generally to flash memory devices and more particularly to a method of fabricating flash memory devices having an ONO layer which contains a silicon nitride layer sandwiched between two silicon oxide layers.

2. Description of the Related Art

A flash memory having an ONO layer is illustrated in FIG. 1. It includes an ONO layer 60 disposed on top of a silicon substrate 10, and a control gate 71, typically of polysilicon, disposed on top of the ONO layer 60. The ONO layer 60 comprises a lower layer 61 made of silicon oxide, a middle layer 62 made of silicon nitride, and an upper layer 63 made of silicon oxide.

FIGS. 2A–2J illustrate the conventional process for fabricating a flash memory device having an ONO layer. First, a silicon oxide layer 20 is thermally grown on the silicon substrate 10 to form the structure of FIG. 2A. Then, as shown in FIG. 2B, nitrogen atoms (N or $N_2$) are implanted into the silicon oxide layer 20.

The nitrogen implanting step is followed by heating to anneal out the implant damage and to diffuse the implanted nitrogen to the $Si/SiO_2$ interface 21 and cause SiN bonds to be formed at the $Si/SiO_2$ interface 21. The heating is performed in a furnace and the entire heating process takes several hours because the process requires a long time to ramp up and ramp down.

Subsequently, a silicon nitride layer 30 is deposited on top of the silicon oxide layer 20 by chemical vapor deposition (CVD). FIG. 2C shows the silicon nitride layer 30 deposited on tip of the silicon oxide layer 20. A second layer of silicon oxide 40 is then formed on top of the silicon nitride layer 30 and the resulting structure is shown in FIG. 2D. Thereafter, as shown in FIG. 2E, a photoresist 50 is formed on top of the 4 second silicon oxide layer 40, and this semiconductor structure is etched until an upper surface of the silicon substrate 10 is exposed. The resulting structure, shown in FIG. 2F, is subsequently implanted with arsenic and boron ions using the remaining photoresist 50 as a mask and heated to diffuse the implanted ions to form source/drain regions 62 and 64.

The remaining photoresist 50 is stripped away and, as shown in FIG. 2G, a polysilicon layer 70 is deposited on top of the exposed surface of the silicon substrate 10 and on top and sidewalls of the ONO layer 60. The polysilicon layer 70 is then patterned using conventional lithography techniques and a control gate 71 remains on top of the ONO layer 60. FIG. 2H shows the resulting gate structure 75 including the control gate 71 and the ONO layer 60.

Oxide spacers 81, 82, shown in FIG. 2J, are formed on the sidewalls of the gate structure 75 by (i) depositing a conformal layer of silicon oxide 80 by CVD on the exposed surface of the silicon substrate 10 and on top and sidewalls of the gate structure 75 (FIG. 2I), and (ii) anisotropically etching the deposited silicon oxide.

SUMMARY OF THE INVENTION

The invention provides a process for forming an ONO flash memory device using rapid thermal annealing or reoxidation that improves processing speed, reduces thermal budget, and reduces diffusion of dopants in channels.

The invention produces a gate structure for an ONO flash memory device that includes a first layer of silicon oxide on top of a semiconductor substrate, a second layer of silicon oxide, a layer of silicon nitride sandwiched between the two silicon oxide layers, and a control gate on top of the second layer of silicon oxide. Nitrogen is implanted into the first layer of silicon oxide and the semiconductor structure is heated in a rapid thermal annealing chamber to anneal out the implant damage and to diffuse the implanted nitrogen to the substrate and silicon oxide interface to cause SiN bonds to be formed at that interface. The SiN bonds is desirable because they improve the bonding strength at the interface and the nitrogen remaining in the silicon oxide layer increases the oxide bulk reliability.

The invention employs rapid thermal annealing or rapid thermal re-oxidation using a rapid thermal tool in place of heating in a conventional furnace because (i) it anneals out damage in the substrate resulting from nitrogen implantation better than the conventional furnace process and (ii) it prevents excess movement of dopants implanted in channels.

Additional objects, features and advantages of the invention will be set forth in the description of preferred embodiments which follows.

BRIEF DESCRIPTION OF THE DRAWINGS

The invention is described in detail herein will reference lo the drawings in which.

The accompanying drawings, which are incorporated in and constitute a part of the specification, illustrate presently preferred exemplary embodiments of the invention, and, together with the general description given above and the detailed description of the preferred embodiments given below, serve to explain the principles of the invention.

DETAILED DESCRIPTION OF THE PREFERRED EMBODIMENTS

Figure 1:
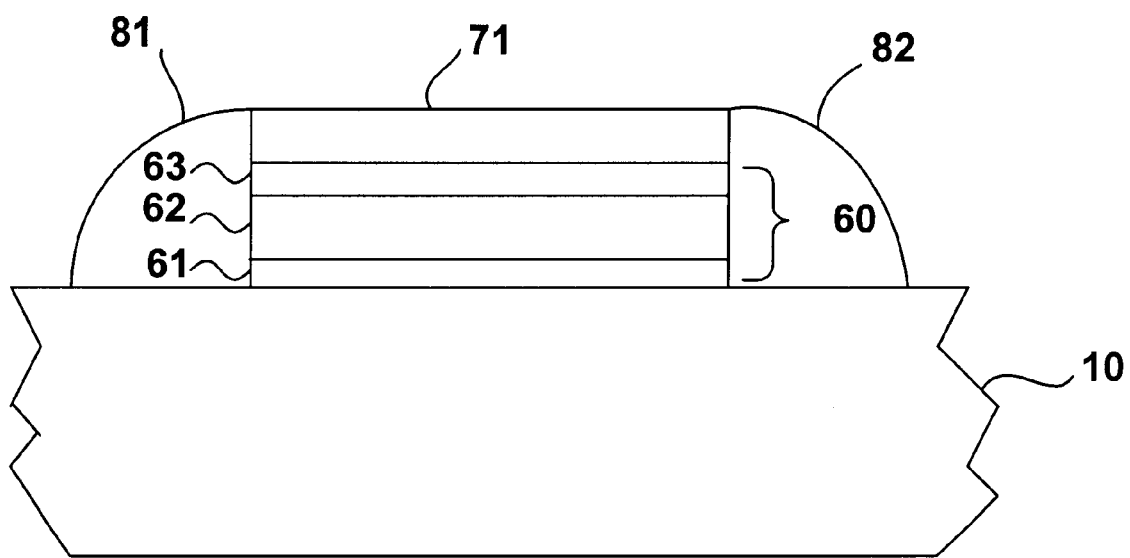
FIG. 1 illustrates in a cross section a flash memory device having an ONO layer.
Figure 2A:
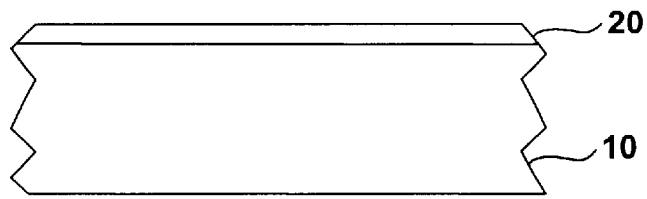
FIGS. 2A–2J illustrate the conventional process for forming a flash memory device having an ONO layer.
Figure 2B:
Figure 2B:
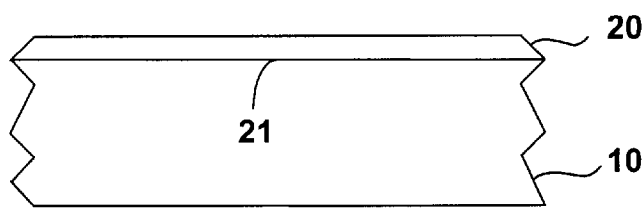
Figure 2C:
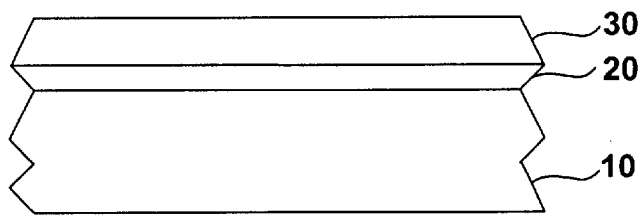
Figure 2D:
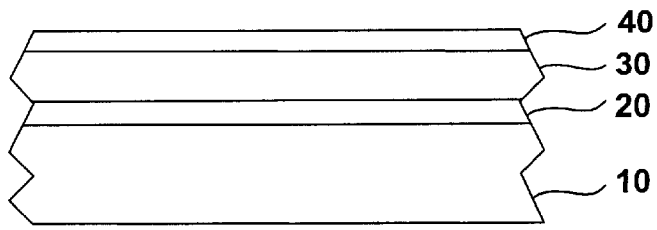
Figure 2E:
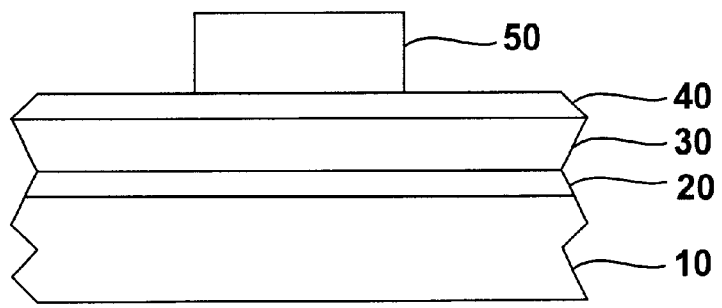
Figure 2F:
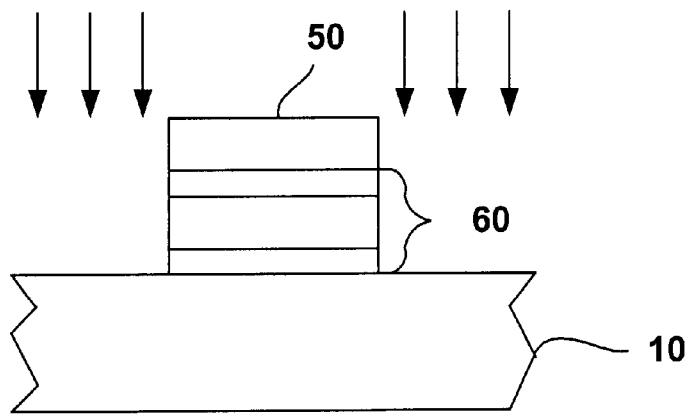
Figure 2G:
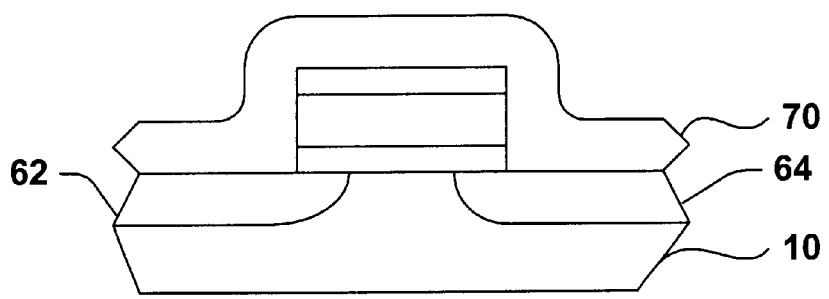
Figure 2H:
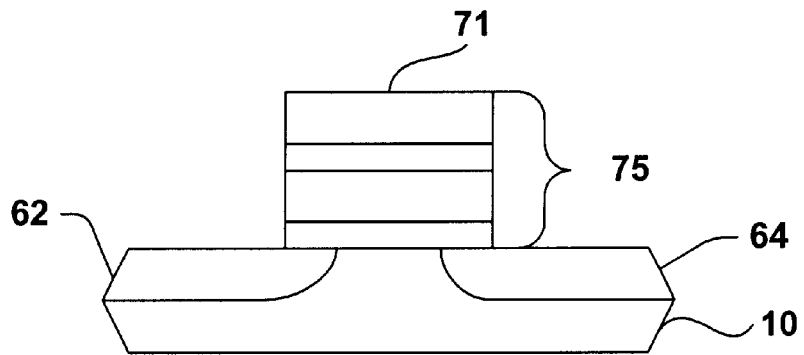
Figure 2I:
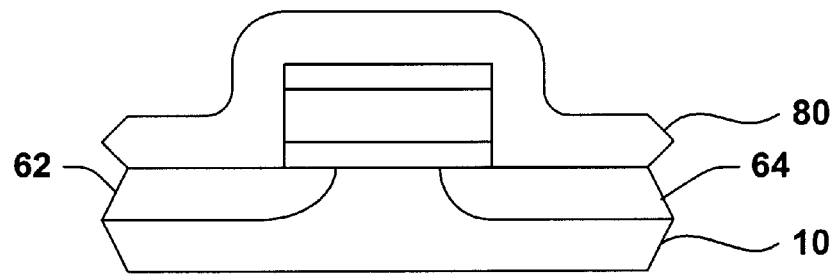
Figure 2J:
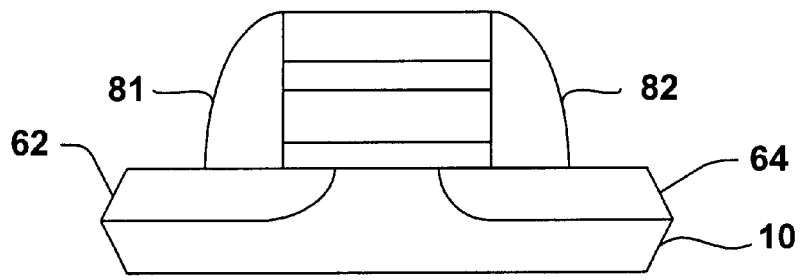
Figure 3A:
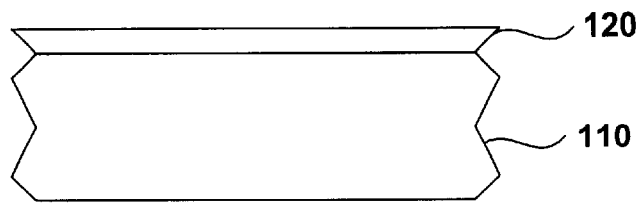
FIGS. 3A–3K illustrate the process according to an embodiment of the invention for forming a flash memory device having an ONO layer.

FIGS. 3A–3K illustrate the process according to an embodiment of the invention for fabricating a flash memory device having an ONO layer. First, as shown in FIG. 3A, a silicon oxide layer 120 is thermally grown on the silicon substrate 110 to a thickness of about 50–150 Å by heating the semiconductor substrate 110.

Figure 3B:
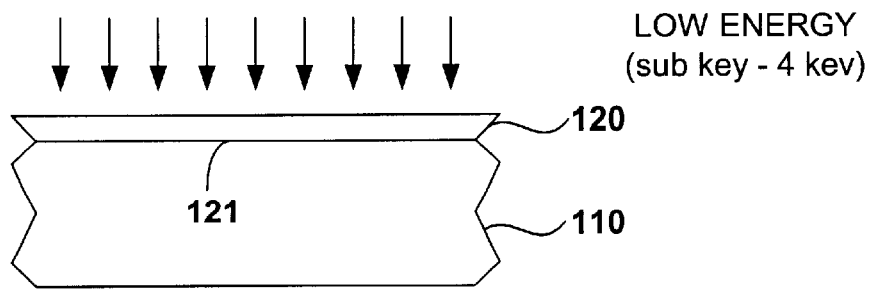
Figure 3C:
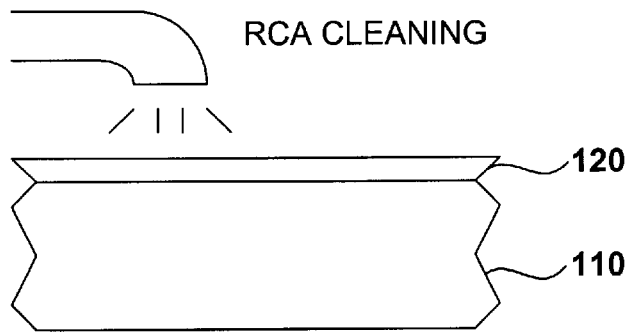

Then, as shown in FIG. 3B, nitrogen atoms (N or $N_2$) are implanted into the silicon oxide layer 120. Optionally, after the nitrogen implantation step, the top surface of the silicon oxide layer 120 may undergo RCA cleaning (wet chemical cleaning) to remove implant contamination. The RCA cleaning step is illustrated schematically in FIG. 3C.

The nitrogen implantation or RCA clean step is followed by rapid thermal annealing in a nitrogen or argon atmosphere or rapid thermal re-oxidation in an oxygen atmosphere. Both the rapid thermal annealing and the rapid thermal re-oxidation processes are photon-assisted processes and are carried out in a rapid thermal annealing chamber. An example of a rapid thermal annealing chamber is disclosed in U.S. Pat. No. 6,044,203, the entire contents of which are incorporated by reference herein. The rapid thermal processes anneal out the implant damage and diffuses the implanted nitrogen to the $Si/SiO_2$ interface 121 to cause SiN bonds to be formed at the $Si/SiO_2$ interface 121. The SiN bonds are desirable because they improve the bonding strength at the $Si/SiO_2$ interface 121 of the resulting flash memory device. Further, some nitrogen remaining in the silicon oxide layer 120 increases the oxide bulk reliability, and protects the silicon oxide layer 120 against time-dependent dielectric breakdown.

The invention employs heating using a rapid thermal tool in place of heating in a conventional furnace because it provides the following advantages.

First, the rapid thermal tool process is a photon-assisted process. The energy is not only carried by thermal conductivity, as in the conventional furnace process, but more directly through the photon shining on the silicon, because the defect sites are more willing to react with the incident photon. Therefore, the rapid thermal tool process anneals out damage in the substrate resulting form nitrogen implantation better than the conventional furnace process. For example, during defect annealing, the total time is proportional to exp(−E/C), wherein E is the energy and C is a constant. Because energy from a photon is much higher locally than energy from a thermal process, the rapid thermal tool process (a photon-assisted process) anneals out defects much faster than the conventional furnace process.

Second, the rapid thermal tool process is a faster process because it needs almost no time to ramp up to the annealing temperature and very short time to ramp down from the annealing temperature. As a result, it prevents excess movement of dopants implanted in channels. By contrast, in the conventional furnace process, it takes the furnace a long time to ramp up and ramp down. As a result, the entire heating process takes several hours, and the dopants implanted in channels move excessively during this period as they are subjected to high temperatures for several hours.

Figure 3D:
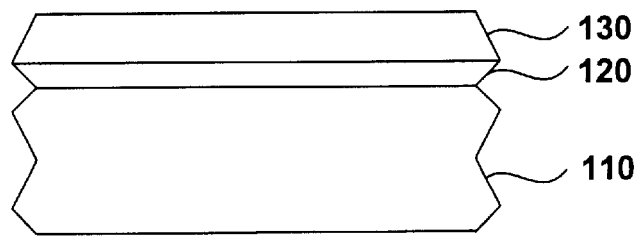
Figure 3E:
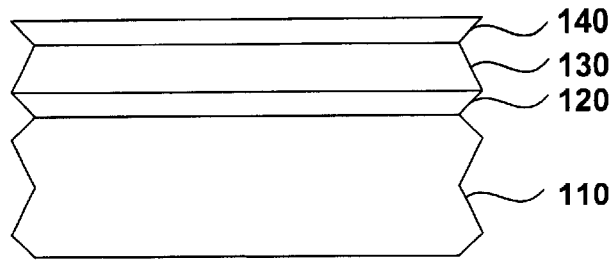

Subsequently, a silicon nitride layer 130 is deposited on top of the silicon oxide layer 120 by chemical vapor deposition (CVD) to a thickness of about 50–80 Å. FIG. 3D shows a silicon nitride layer 130 that has been deposited on top of the silicon oxide layer 120. A second layer of silicon oxide 140 is then formed on top of the silicon nitride layer 130 and the resulting structure is shown in FIG. 3E.

Figure 3F:
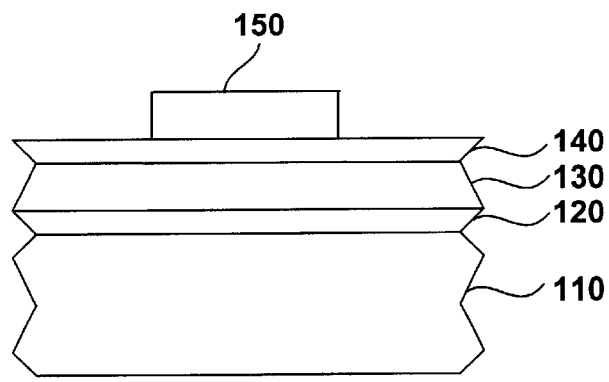
Figure 3G:
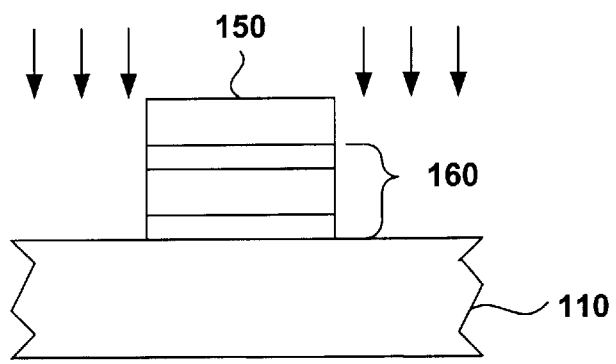

Thereafter, as shown in FIG. 3F, a photoresist 150 is formed on top of the second silicon oxide layer 140, and this semiconductor structure is etched until an upper surface of the silicon substrate 110 is exposed. The resulting structure, shown in FIG. 3G, is subsequently implanted with arsenic and boron ions using the remaining photoresist 150 as a mask and heated to diffuse the implanted ions to form source/drain regions 162 and 164.

Figure 3H:
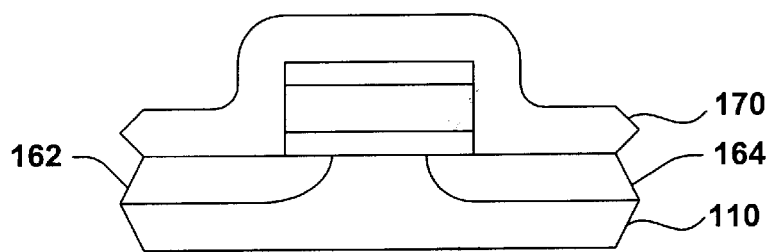
Figure 3I:
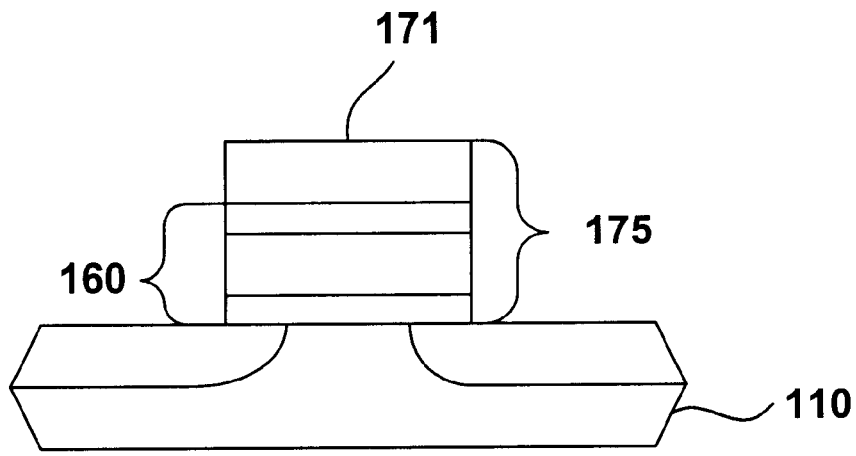
Figure 3J:
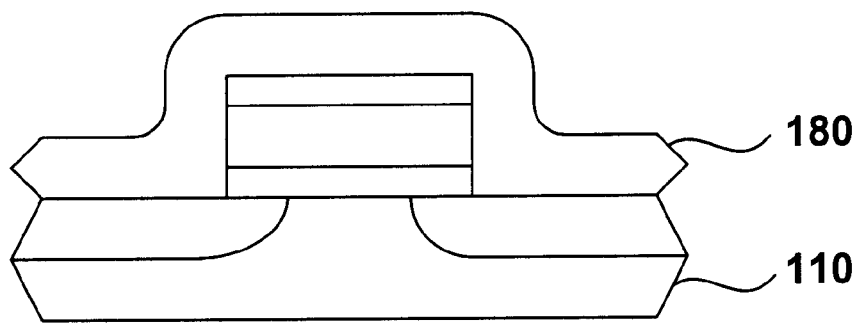

The remaining photoresist 150 is stripped away and, as shown in FIG. 3H, a polysilicon layer 170 is deposited on top of the exposed surface of the silicon substrate 110 and on top and sidewalls of the ONO layer 160. The polysilicon layer 170 is then patterned using conventional lithography techniques and a control gate 171 remains on top of the ONO layer 160. FIG. 3I shows the resulting gate structure 175 including the control gate 171 and the ONO layer 160.

Figure 3K:
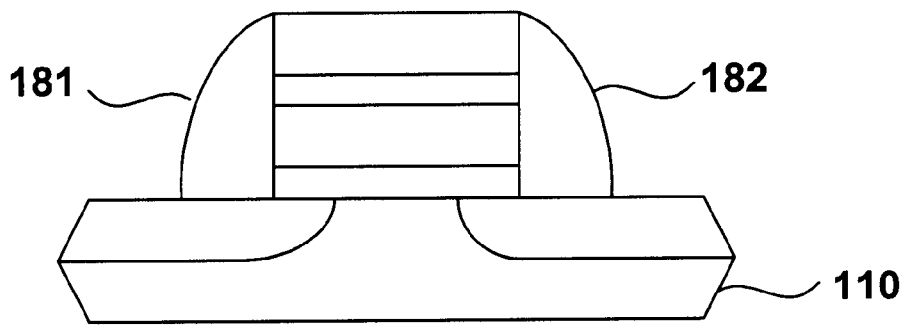

Oxide spacers 181, 182, shown in FIG. 3K, are formed on the sidewalls of the gate structure 175 by (i) depositing a conformal layer of silicon oxide 180 by CVD on the exposed surface of the silicon substrate 110 and on top and sidewalls of the gate structure 175 (FIG. 3J), and (ii) anisotropically etching the deposited silicon gate oxide.

While particular embodiments according to the invention have been illustrated and described above, it will be clear that the invention can take a variety of forms and embodiments within the scope of the appended claims.

We claim:

1. In a flash memory device having an ONO layer that includes an upper layer of silicon oxide, a middle layer of silicon nitride, and a lower layer of silicon oxide, a method of forming the lower layer of silicon oxide on top of a semiconductor substrate, comprising the steps of:

heating the semiconductor substrate in an atmosphere containing oxygen to form a silicon oxide layer on top of the semiconductor substrate;

implanting nitrogen into the silicon oxide layer; and heating the semiconductor substrate having the nitrogen-implanted silicon oxide layer thereon using a rapid thermal tool.

2. The method according to claim 1, wherein the second step of heating is performed in an atmosphere containing an inert gas.

3. The method according to claim 2, wherein the second step of heating is performed in an atmosphere containing nitrogen.

4. The method according to claim 2, wherein the second step of heating is performed in an atmosphere containing argon.

5. The method according to claim 1, wherein the second step of heating is performed in an atmosphere containing oxygen.

6. The method according to claim 1, further comprising a step of RCA cleaning the silicon oxide layer after the nitrogen implantation.

7. A method of forming a gate structure for a flash memory device on top of a semiconductor substrate, comprising the steps of:

heating the semiconductor substrate in an atmosphere containing oxygen to form a first silicon oxide layer on top of the semiconductor substrate;

implanting nitrogen into the first silicon oxide layer;

heating the semiconductor substrate having the nitrogen-implanted first silicon oxide layer thereon using a photon-assisted process;

forming a nitride layer on top of the first oxide layer;

forming a second silicon oxide layer on top of the nitride layer;

selectively etching the nitrogen-implanted first silicon oxide layer, the silicon nitride layer, and the second silicon oxide layer to form an ONO structure; and forming a control gate on top of the ONO structure.

8. The method according to claim 7, wherein the photon-assisted process includes a rapid thermal annealing process.

9. The method according to claim 7, wherein the photon-assisted process includes a rapid thermal re-oxidation process.

10. The method according to claim 7, wherein the second step of heating is performed in an atmosphere containing an inert gas.

11. The method according to claim 10, wherein the second step of heating is performed in an atmosphere containing nitrogen.

12. The method according to claim 10, wherein the second step of heating is performed in an atmosphere containing argon.

13. The method according to claim 7, wherein the second step of heating is performed in an atmosphere containing oxygen.

14. The method according to claim 7, further comprising a step of RCA cleaning the first silicon oxide layer after the nitrogen implantation.

* * * * *

UNITED STATES PATENT AND TRADEMARK OFFICE
CERTIFICATE OF CORRECTION

PATENT NO.   : 6,395,654 B1
DATED        : May 28, 2002
INVENTOR(S)  : Jean Yang, Yider Wu, Hidehiko Shiraiwa and Mark Ramsbey It is certified that error appears in the above-identified patent and that said Letters Patent is hereby corrected as shown below:

<u>Column 1,</u>
Line 40, please delete the number "4" before the word "second".

Signed and Sealed this

Eighth Day of October, 2002

*Attest:*

*Attesting Officer*

JAMES E. ROGAN
*Director of the United States Patent and Trademark Office*